(12) United States Patent
Zhang

(10) Patent No.: US 12,261,212 B2
(45) Date of Patent: Mar. 25, 2025

(54) MANUFACTURING METHOD OF SEMICONDUCTOR STRUCTURE

(71) Applicant: United Microelectronics Corp., Hsinchu (TW)

(72) Inventor: Zhenhai Zhang, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 436 days.

(21) Appl. No.: 17/749,155

(22) Filed: May 20, 2022

(65) Prior Publication Data

US 2022/0278220 A1    Sep. 1, 2022

Related U.S. Application Data

(62) Division of application No. 16/989,693, filed on Aug. 10, 2020, now Pat. No. 11,367,781, which is a division of application No. 15/637,741, filed on Jun. 29, 2017, now Pat. No. 10,797,155.

(30) Foreign Application Priority Data

Jun. 1, 2017 (CN) .......................... 201710403145.X

(51) Int. Cl.
*H01L 29/66* (2006.01)
*H01L 21/8234* (2006.01)
*H01L 27/088* (2006.01)
*H01L 29/40* (2006.01)
(Continued)

(52) U.S. Cl.
CPC .. *H01L 29/6653* (2013.01); *H01L 21/823425* (2013.01); *H01L 21/823468* (2013.01); *H01L 27/088* (2013.01); *H01L 29/401* (2013.01); *H01L 29/665* (2013.01);
(Continued)

(58) Field of Classification Search
CPC .................... H01L 29/6653; H01L 21/823425
See application file for complete search history.

(56) References Cited

U.S. PATENT DOCUMENTS

| 5,783,475 | A | 7/1998 | Ramaswami |
| 6,188,117 | B1 * | 2/2001 | Jan ..................... H01L 21/82345 257/E21.199 |
| 6,251,762 | B1 | 6/2001 | Jan et al. |

(Continued)

FOREIGN PATENT DOCUMENTS

CN        101047182        10/2007

*Primary Examiner* — Aaron J Gray
(74) *Attorney, Agent, or Firm* — JCIPRNET

(57) ABSTRACT

A manufacturing method of the semiconductor structure including the following is provided. Gate structures are formed on a substrate. Each gate structure includes a gate, a first spacer, and a second spacer. The gate is disposed on the substrate. The first spacer is disposed on a sidewall of the gate. The second spacer is disposed on the first spacer. In a region between two adjacent gate structures, the first spacers are separated from each other, and the second spacers are separated from each other. A protective layer is formed between the two adjacent gate structures. The protective layer covers lower portions of the second spacers and exposes upper portions of the second spacers. A part of the upper portions of the second spacers is removed using the protective layer as a mask to enlarge a distance between the upper portions of the second spacers. The protective layer is removed.

8 Claims, 11 Drawing Sheets

(51) Int. Cl.
  *H01L 29/423* (2006.01)
  *H01L 29/78* (2006.01)
(52) U.S. Cl.
  CPC ...... *H01L 29/6656* (2013.01); *H01L 29/7847* (2013.01); *H01L 29/42324* (2013.01)

(56) References Cited

U.S. PATENT DOCUMENTS

| | | | |
|---|---|---|---|
| 6,251,764 | B1 | 6/2001 | Pradeep et al. |
| 6,468,915 | B1 | 10/2002 | Liu |
| 6,506,650 | B1 * | 1/2003 | Yu .................... H01L 21/26506 |
| | | | 438/303 |
| 6,632,745 | B1 * | 10/2003 | Yap ...................... H01L 29/665 |
| | | | 438/738 |
| 10,056,473 | B1 * | 8/2018 | Wang ................... H01L 21/845 |
| 2003/0025163 | A1 | 2/2003 | Kwon |
| 2005/0112817 | A1 | 5/2005 | Cheng et al. |
| 2010/0163938 | A1 * | 7/2010 | Park ................. H01L 21/28518 |
| | | | 257/E21.546 |
| 2011/0248321 | A1 | 10/2011 | Guo et al. |
| 2013/0270613 | A1 * | 10/2013 | Chou ................. H01L 29/7843 |
| | | | 257/E21.409 |
| 2014/0087535 | A1 * | 3/2014 | Roh ................. H01L 29/66553 |
| | | | 438/285 |
| 2014/0127893 | A1 * | 5/2014 | Huang ............. H01L 29/66636 |
| | | | 438/590 |
| 2014/0242770 | A1 | 8/2014 | Huang et al. |
| 2015/0162201 | A1 | 6/2015 | Lee et al. |

* cited by examiner

MANUFACTURING METHOD OF SEMICONDUCTOR STRUCTURE

CROSS REFERENCE TO RELATED APPLICATION

This application is a divisional application of and claims the priority benefit of U.S. application Ser. No. 16/989,693, filed on Aug. 10, 2020, now allowed. The prior U.S. application Ser. No. 16/989,693 is a divisional application of and claims the priority benefit of U.S. application Ser. No. 15/637,741, filed on Jun. 29, 2017, now patented, which claims the priority benefit of China application serial no. 201710403145.X, filed on Jun. 1, 2017. The entirety of each of the above-mentioned patent applications is hereby incorporated by reference herein and made a part of specification.

BACKGROUND OF THE INVENTION

Field of the Invention

The invention relates to a semiconductor structure and a manufacturing method thereof and particularly relates to a semiconductor structure and a manufacturing method thereof for forming a good metal silicide.

Description of Related Art

In the manufacturing process of forming a metal silicide, the salicide blocking (SAB) layer in the predetermined region for forming the metal silicide is to be removed first. However, as the distance between the gates shortens, it is more difficult to remove the SAB layer between the gates in the predetermined region for forming the metal silicide, and thus the problem of poor formation of the metal silicide arises therein.

SUMMARY OF THE INVENTION

The invention provides a semiconductor structure and a manufacturing method thereof for forming a good metal silicide.

The semiconductor structure of the invention includes a substrate and gate structures. The gate structures are disposed on the substrate. Each of the gate structures includes a gate, a first spacer, and a second spacer. The gate is disposed on the substrate. The first spacer is disposed on a sidewall of the gate. The second spacer is disposed on the first spacer. In a region between two adjacent gate structures, the first spacers are separated from each other, the second spacers are separated from each other, and an upper portion of each of the second spacers has a recess.

In the semiconductor structure according to an embodiment of the invention, the first spacer may extend between the second spacer and the substrate.

In the semiconductor structure according to an embodiment of the invention, each of the gate structures may further include a first dielectric layer. The first dielectric layer is disposed between the gate and the substrate.

In the semiconductor structure according to an embodiment of the invention, each of the gate structures may further include a hard mask layer. The hard mask layer is disposed on the gate.

A manufacturing method of the semiconductor structure of the invention includes the following. Gate structures are formed on a substrate. Each of the gate structures includes a gate, a first spacer, and a second spacer. The gate is disposed on the substrate. The first spacer is disposed on a sidewall of the gate. The second spacer is disposed on the first spacer. In a region between two adjacent gate structures, the first spacers are separated from each other, and the second spacers are separated from each other. A protective layer is formed in the region between the two adjacent gate structures. The protective layer covers lower portions of the second spacers and exposes upper portions of the second spacers. A part of the upper portions of the second spacers is removed using the protective layer as a mask to enlarge a distance between the upper portions of the second spacers. The protective layer is removed.

In the manufacturing method of the semiconductor structure according to an embodiment of the invention, the first spacer may extend between the second spacer and the substrate.

In the manufacturing method of the semiconductor structure according to an embodiment of the invention, each of the gate structures may further include a first dielectric layer. The first dielectric layer is disposed between the gate and the substrate.

In the manufacturing method of the semiconductor structure according to an embodiment of the invention, each of the gate structures may further include a hard mask layer. The hard mask layer is disposed on the gate.

In the manufacturing method of the semiconductor structure according to an embodiment of the invention, the steps of forming the protective layer and removing the part of the upper portions of the second spacers include the following. A reactive ion etching (RIE) process is performed to the second spacers with an etching gas to form the protective layer, and the part of the upper portions of the second spacers is removed simultaneously. The etching gas includes a chlorine gas ($Cl_2$), an oxygen gas ($O_2$), and an inert gas.

In the manufacturing method of the semiconductor structure according to an embodiment of the invention, the material of the protective layer is, for example, a polymer.

In the manufacturing method of the semiconductor structure according to an embodiment of the invention, the step of removing the protective layer comprises, for example, plasma ashing.

In the manufacturing method of the semiconductor structure according to an embodiment of the invention, the step of forming the protective layer includes the following. A buffer layer is formed conformally on the gate structures. A stress adjusting layer is formed on the buffer layer. The stress adjusting layer fills in between the second spacers. A part of the stress adjusting layer is removed to form a first sub-protective layer. The first sub-protective layer exposes the buffer layer on the upper portions of the second spacers. A part of the buffer layer is removed using the first sub-protective layer as a mask to form a second sub-protective layer. The second sub-protective layer exposes the upper portions of the second spacers.

In the manufacturing method of the semiconductor structure according to an embodiment of the invention, the step of forming the protective layer may further include performing an annealing process to the stress adjusting layer after the stress adjusting layer is formed.

In the manufacturing method of the semiconductor structure according to an embodiment of the invention, the step of removing the protective layer includes the following. The first sub-protective layer is removed as the part of the upper portions of the second spacers is removed. The second sub-protective layer is removed.

In the manufacturing method of the semiconductor structure according to an embodiment of the invention, the step of removing the part of the upper portions of the second spacers and the first sub-protective layer comprises, for example, dry etching.

In the manufacturing method of the semiconductor structure according to an embodiment of the invention, the step of forming the protective layer includes the following. A buffer layer is formed conformally on the gate structures. A stress adjusting layer is formed on the buffer layer. The stress adjusting layer fills in between the second spacers. An annealing process is performed to the stress adjusting layer. The stress adjusting layer is removed. A filling layer is formed on the buffer layer. The filling layer fills in between the second spacers. A part of the filling layer is removed to form a first sub-protective layer, and a part of the buffer layer is removed to form a second sub-protective layer. The first sub-protective layer and the second sub-protective layer expose the upper portions of the second spacers.

In the manufacturing method of the semiconductor structure according to an embodiment of the invention, the part of the filling layer and the part of the buffer layer may be removed simultaneously.

In the manufacturing method of the semiconductor structure according to an embodiment of the invention, the step of removing the protective layer includes removing the first sub-protective layer and the second sub-protective layer simultaneously.

In the manufacturing method of the semiconductor structure according to an embodiment of the invention, the step of removing the part of the upper portions of the second spacers comprises, for example, dry etching.

The manufacturing method of the semiconductor structure according to an embodiment of the invention may further include the following. A SAB layer covering the gate structures is formed after the protective layer is removed. A part of the SAB layer is removed to expose the gate structures and the substrate between the gate structures. A first metal silicide layer is formed on the gates and a second metal silicide layer is formed on the substrate between the gate structures.

Based on the above, in the semiconductor structure of the invention, since each of the upper portions of the second spacers has a recess, the distance between the upper portions of the second spacers is enlarged, and it is thus advantageous for removing the SAB layer to be filled in between the second spacers, and a good metal silicide may be formed in the predetermined region for forming the metal silicide.

In addition, in the manufacturing method of the semiconductor structure of the invention, since the part of the upper portions of the second spacers is removed using the protective layer as a mask to enlarge the distance between the upper portions of the second spacers, it is advantageous for removing the SAB layer to be filled in between the second spacers, and a good metal silicide may be formed in the predetermined region for forming the metal silicide.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIG. 1A to FIG. 1E are schematic sectional views of a manufacturing process of a semiconductor structure according to an embodiment of the invention.

Figure 1A:
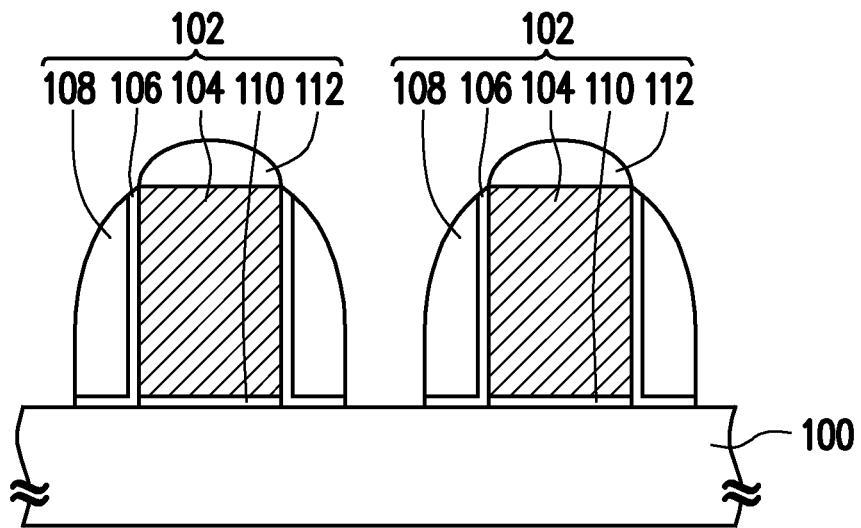
FIG. 1A to FIG. 1E are schematic sectional views of a manufacturing process of a semiconductor structure according to an embodiment of the invention.

Referring to FIG. 1A, gate structures 102 are formed on a substrate 100. Each of the gate structures 102 includes a gate 104, a first spacer 106, and a second spacer 108. The substrate 100 is, for example, a silicon substrate. In addition, a required doped region (not illustrated) or a well (not illustrated) may be formed selectively in the substrate 100 in accordance with the product requirements.

The gate 104 is disposed on the substrate 100. The material of the gate 104 is, for example, a conductor material such as doped polycrystalline silicon. The step of forming the gate 104 comprises, for example, chemical vapor deposition. In this embodiment, gate structures in an n-type metal-oxide-semiconductor (NMOS) transistor region are taken as an example of the gate structures 102, but the invention is not limited thereto. In other embodiments, the gate structures 102 may also be gate structures in a p-type metal-oxide-semiconductor (PMOS) transistor region.

The first spacer 106 is disposed on a sidewall of the gate 104. The second spacer 108 is disposed on the first spacer 106. In a region between two adjacent gate structures 102, the first spacers 106 are separated from each other, and the second spacers 108 are separated from each other. The first spacers 106 may extend between the second spacer 108 and the substrate 100. The material of the first spacer 106 is, for example, a silicon oxide. The material of the second spacer 108 is, for example, a silicon nitride. The steps of forming the first spacer 106 and the second spacer 108 comprise, for example, first conformally forming a first spacer material layer (not illustrated) and a second spacer material layer (not illustrated) on the gate 104, and then performing an etching-back process to the first spacer material layer and the second spacer material layer.

In addition, each of the gate structures 102 may further include at least one of a first dielectric layer 110 and a hard mask layer 112. The first dielectric layer 110 is disposed between the gate 104 and the substrate 100. The first dielectric layer 110 may serve as a gate dielectric layer. The material of the first dielectric layer 110 is, for example, a silicon oxide. The step of forming the first dielectric layer 110 comprises, for example, thermal oxidation or chemical vapor deposition.

The hard mask layer 112 is disposed on the gate 104. The material of the hard mask layer 112 is, for example, a silicon oxide or a silicon nitride. The step of forming the hard mask layer 112 comprises, for example, chemical vapor deposition.

Figure 1B:
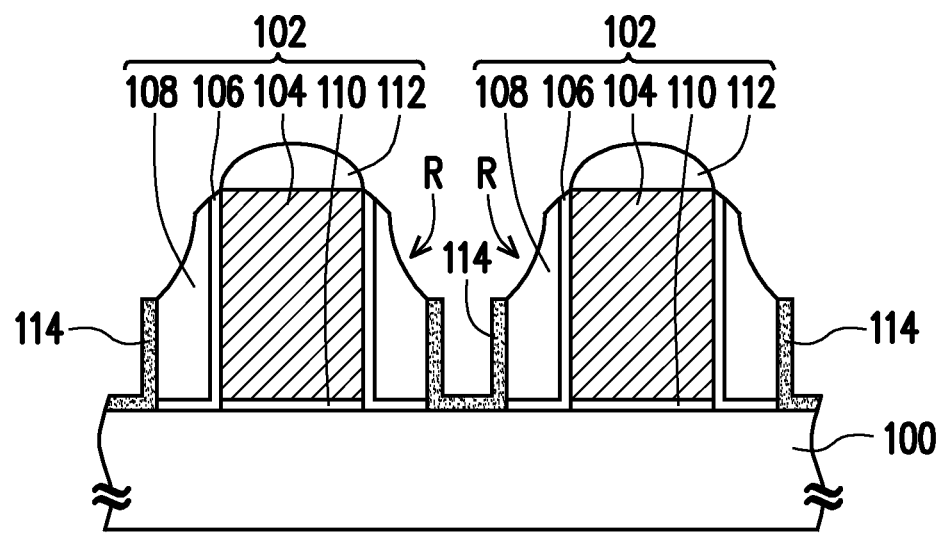

Referring to FIG. 1B, a reactive ion etching (RIE) process is performed to the second spacers 108 with an etching gas to form a protective layer 114 in the region between two adjacent gate structures 102 and remove a part of upper portions of the second spacers 108 simultaneously. The protective layer 114 covers the lower portions of the second spacers 108 and exposes the upper portions of the second spacers 108. Since the lower portions of the second spacers 108 can be protected by the protective layer 114, the protective layer 114 may serve as a mask in the RIE process for removing the part of the upper portions of the second spacers 108 to form a recess R for enlarging a distance between the upper portions of the second spacers 108. The etching gas includes chlorine gas ($Cl_2$), oxygen gas ($O_2$), and inert gas. The inert gas is, for example, argon gas. The material of the protective layer 114 is, for example, a polymer.

Figure 1C:
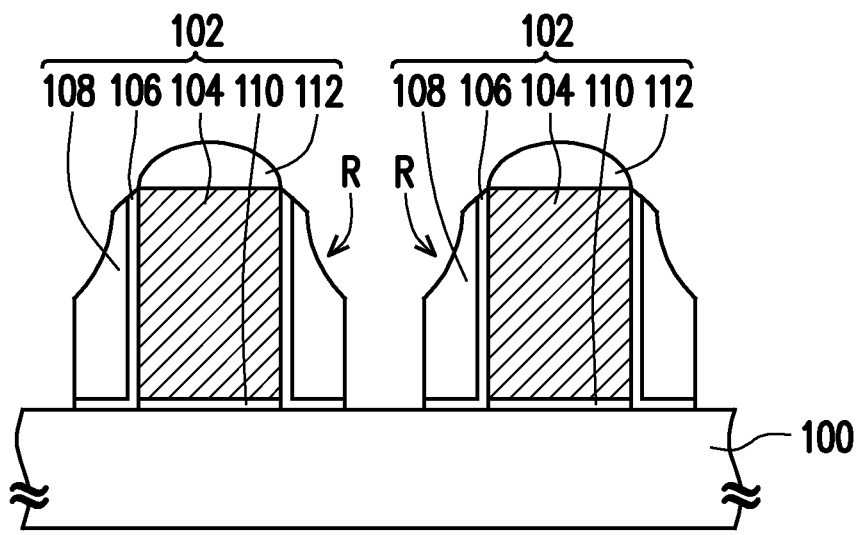

Referring to FIG. 1C, the protective layer 114 is removed. The step of removing the protective layer 114 comprises, for example, plasma ashing, such as oxygen plasma ashing.

Figure 1D:
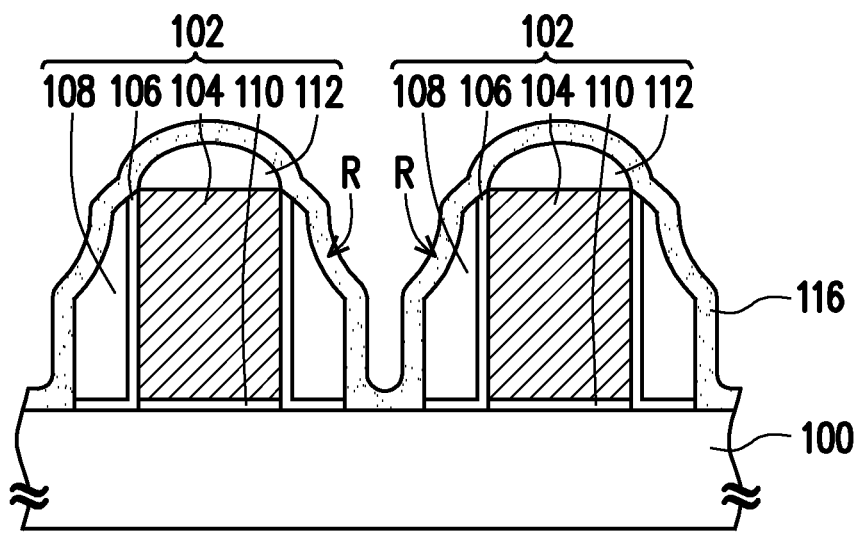

Referring to FIG. 1D, after the protective layer 114 is removed, a SAB layer 116 covering the gate structures 102 is formed. The material of the SAB layer 116 is, for example, a silicon oxide, a silicon nitride, or a silicon oxynitride. The material of the SAB layer 116 is selected with consideration of the material of the first spacer 106 and the second spacer 108 so as for the SAB layer 116 to have an etch selectivity with respect to the first spacer 106 and the second spacer 108. The step of forming the SAB layer 116 comprises, for example, chemical vapor deposition. In this embodiment, the SAB layer 116 may cover both the NMOS transistor region and the PMOS transistor region.

Figure 1E:
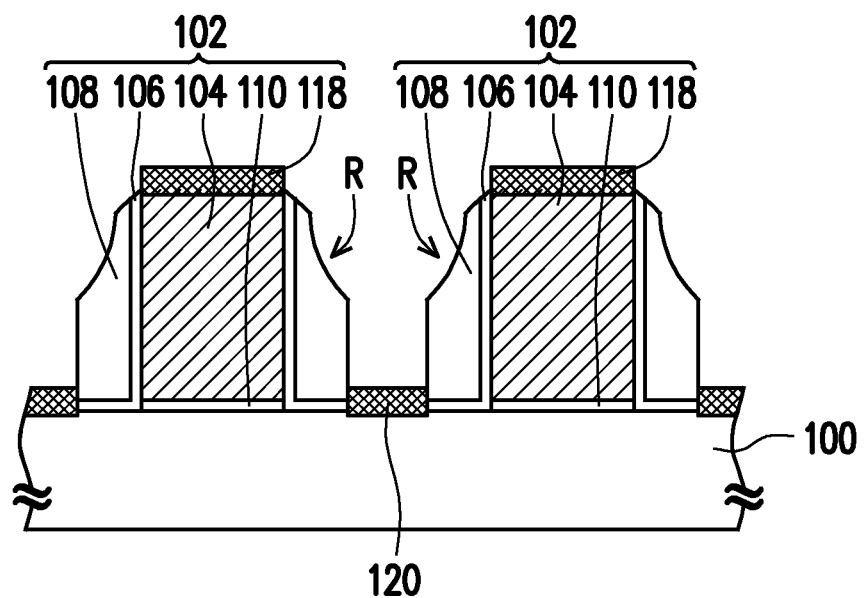

Referring to FIG. 1E, a part of the SAB layer 116 is removed to expose the gate structures 102 and the substrate 100 between the gate structures 102. For instance, if the gate structures 102 are in a transistor region of a core circuit, the SAB layer 116 in the transistor region of the core circuit is removed, as the SAB layer 116 (not illustrated) in the electrostatic discharge (ESD) element region (not illustrated) is retained. The step of removing the part of the SAB layer 116 comprises, for example, performing a patterning process to the SAB layer 116.

The hard mask layer 112 is removed to expose the gate 104. The step of removing the hard mask layer 112 is, for example, dry etching.

A first metal silicide layer 118 is formed on the gate 104, and a second metal silicide layer 120 is formed on the substrate 100 between the gate structures 102. The material of the first metal silicide layer 118 and the material of the second metal silicide layer 120 may be identical material or different materials, such as nickel silicide (NiSi) or cobalt silicide (Co $Si_2$). The step of forming the first metal silicide layer 118 and the second metal silicide layer 120 comprises, for example, performing a salicide process.

According to the above embodiments of the invention, in the manufacturing method of the semiconductor structure, the protective layer 114 is used as the mask to remove the part of the upper portion of the second spacers 108 for enlarging the distance between the upper portions of the second spacers 108. As a result, it is more advantageous for removing the SAB layer 116 to be filled in between the second spacers 108, and a good metal silicide may be formed in the predetermined region for forming the first metal silicide layer 118 and the second metal silicide layer 120.

Provided as follows with reference to FIG. 1C is the description of the semiconductor structure according to the embodiment of the invention.

Referring to FIG. 1C, the semiconductor structure includes the substrate 100 and the gate structures 102. The gate structures 102 are disposed on the substrate 100. Each of the gate structures 102 includes the gate 104, the first spacer 106, and the second spacer 108. The gate 104 is disposed on the substrate 100. The first spacer 106 is disposed on the sidewall of the gate 104. The second spacer 108 is disposed on the first spacer 106. The first spacer 106 may extend between the second spacer 108 and the substrate 100. In the region between two adjacent gate structures 102, the first spacers 106 are separated from each other, the second spacers 108 are separated from each other, and the upper portion of each of the second spacers 108 has a recess R. In addition, each of the gate structures 102 may further include at least one of the first dielectric layer 110 and the hard mask layer 112. The first dielectric layer 110 is disposed between the gate 104 and the substrate 100. The hard mask layer 112 is disposed on the gate 104. Besides, detailed descriptions of the materials, characteristics, methods of forming, and dispositions of each component of the semiconductor structure are provided in the above embodiments and are not repeated hereinafter.

According to the above embodiments of the invention, in the semiconductor structure, since the upper portion of each of the second spacers 108 has the recess R, the distance between the upper portions of the second spacers 108 is enlarged. As a result, it is more advantageous for removing the SAB layer 116 to be filled in between the second spacers 108, and a good metal silicide may be formed in the predetermined region for forming the first metal silicide layer 118 and the second metal silicide layer 120 (referring to FIG. 1E).

Figure 2A:
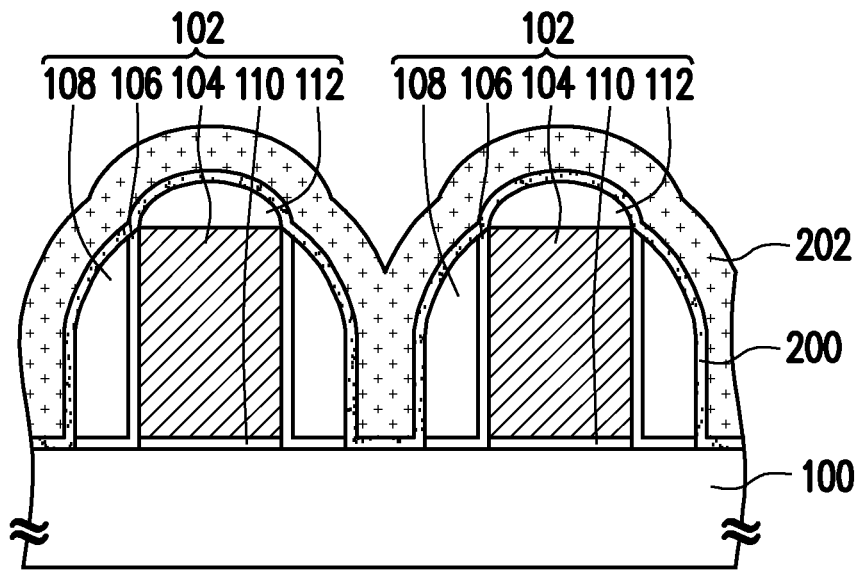
FIG. 2A to FIG. 2G are schematic sectional views of a manufacturing process of a semiconductor structure according to another embodiment of the invention.

FIG. 2A to FIG. 2G are schematic sectional views of a manufacturing process of a semiconductor structure according to another embodiment of the invention, wherein FIG. 2A is a descriptive drawing following FIG. 1A. If not particularly specified, reference numerals as in FIG. 2A to FIG. 2G that are identical to the reference numerals as in FIG. 1A indicate identical components of similar materials, characteristics, dispositions, methods of forming, and effects described with respect to FIG. 1A, which are not repeated hereinafter.

Referring to FIG. 1A and FIG. 2A, after the gate structures 102 are formed on the substrate 100, a buffer layer 200 is formed conformally on the gate structures 102. The material of the buffer layer 200 is, for example, a silicon oxide. The step of forming the buffer layer 200 comprises, for example, chemical vapor deposition.

A stress adjusting layer 202 is formed on the buffer layer 200. The stress adjusting layer 202 fills in between the second spacers 108. The material of the stress adjusting layer 202 is, for example, a silicon nitride having a tensile stress or a compressive stress. The step of forming the stress adjusting layer 202 comprises, for example, chemical vapor deposition.

After the stress adjusting layer 202 is formed, an annealing process may be performed to the stress adjusting layer 202 to transmit the stress to the channel under the gate 104.

Figure 2B:
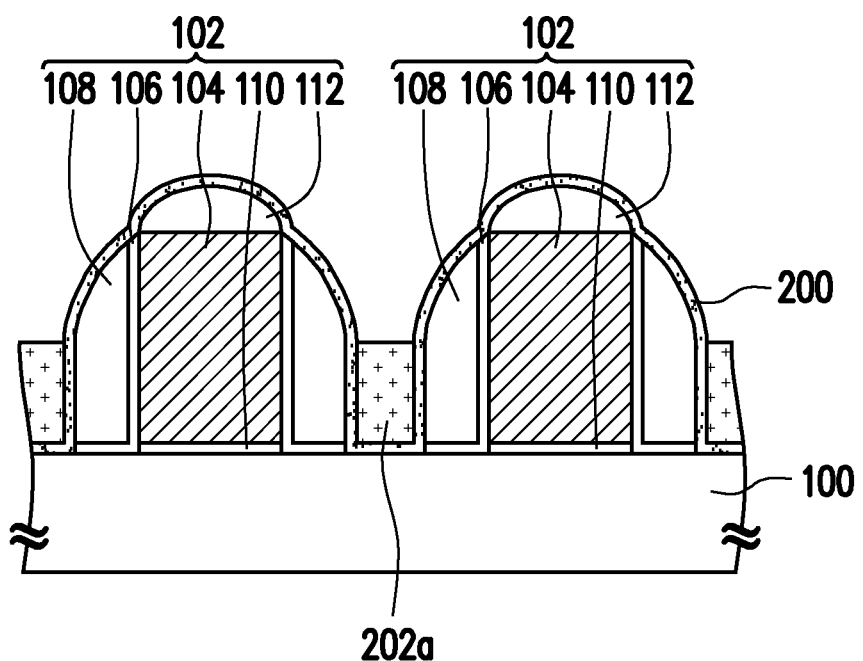

Referring to FIG. 2B, a part of the stress adjusting layer 202 is removed to form a first sub-protective layer 202a. The first sub-protective layer 202a exposes the buffer layer 200 on the upper portions of the second spacers 108. The step of removing the part of the stress adjusting layer 202 comprises, for example, dry etching or wet etching.

Figure 2C:
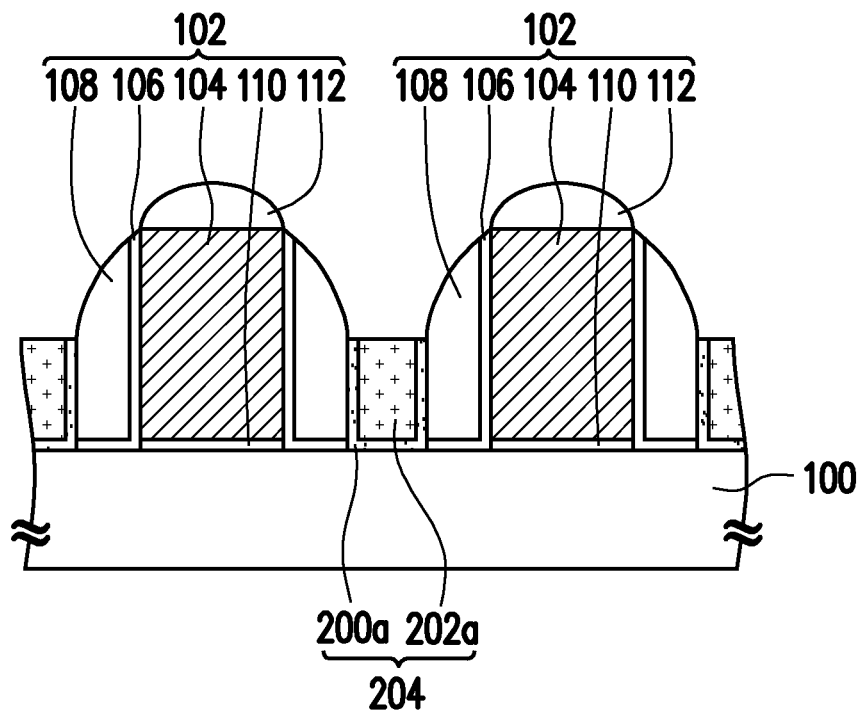

Referring to FIG. 2C, the first sub-protective layer 202a is used as a mask and a part of the buffer layer 200 is removed to form a second sub-protective layer 200a. The second sub-protective layer 200a exposes the upper portions of the second spacers 108. The step of removing the part of the buffer layer 200 is, for example, dry etching or wet etching.

A protective layer 204 may thereby be formed in the region between two adjacent gate structures 102. The protective layer 204 includes the first sub-protective layer 202a and the second sub-protective layer 200a, wherein the first sub-protective layer 202a is disposed on the second sub-protective layer 200a. The protective layer 204 covers the lower portions of the second spacers 108 and exposes the upper portions of the second spacers 108.

Figure 2D:
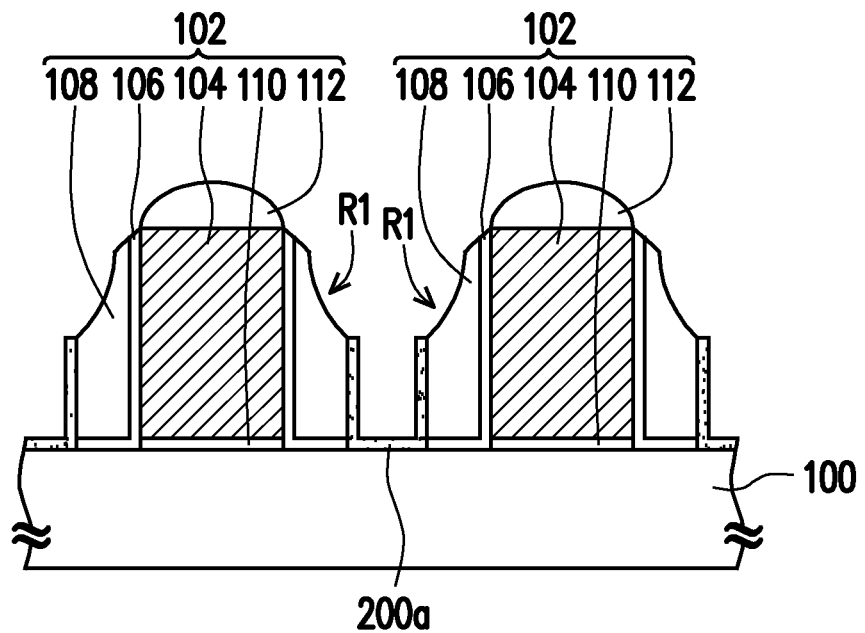

Referring to FIG. 2D, the protective layer 204 is used as a mask and the part of the upper portions of the second spacers 108 is removed to form a recess R1 for enlarging the distance between the upper portions of the second spacers 108. As the part of the upper portions of the second spacers 108 is removed, the first sub-protective layer 202a may be removed. The step of removing the part of the upper portions of the second spacers 108 and the first sub-protective layer 202a comprises, for example, dry etching such as RIE.

Figure 2E:
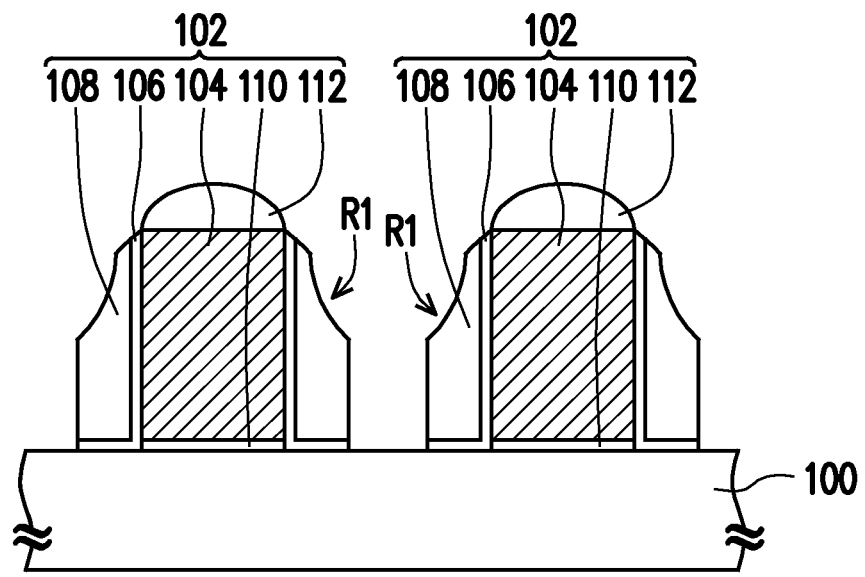

Referring to FIG. 2E, the second sub-protective layer 200a is removed. The step of removing the second sub-protective layer 200a comprises, for example, wet etching. For instance, a diluted hydrofluoric acid (DHF) may be used to remove the second sub-protective layer 200a.

Figure 2F:
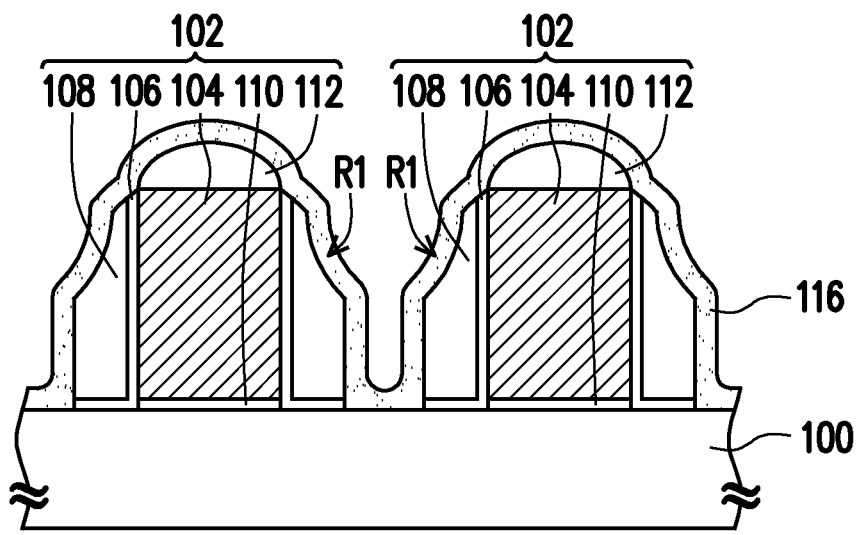
Figure 2G:
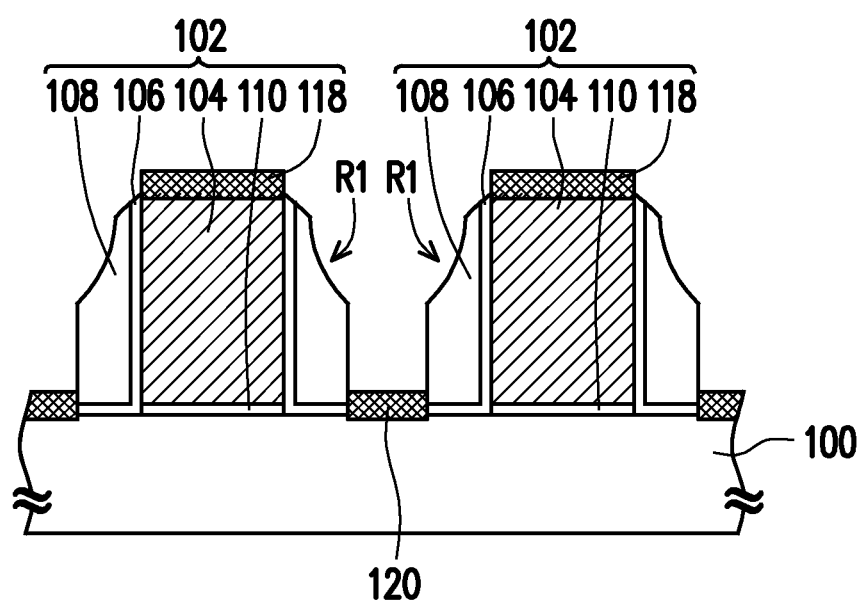

Referring to FIG. 2F, after the protective layer 204 is removed, the SAB layer 116 covering the gate structures 102 may be formed. Referring to FIG. 2G, a part of the SAB layer 116 is removed to expose the gate structures 102 and the substrate 100 between the gate structures 102. The hard mask layer 112 is removed to expose the gate 104. The first metal silicide layer 118 is formed on the gate 104, and the second metal silicide layer 120 is formed on the substrate 100 between the gate structures 102. The processes as in FIG. 2F and FIG. 2G are identical to the processes as in FIG. 1D and FIG. 1E, so the identical reference numerals indicate the identical components, and repeated descriptions thereof are omitted.

According to the above embodiment of the invention, in the manufacturing method of the semiconductor structure, the protective layer 204 is used as the mask to remove the part of the upper portions of the second spacers 108 for enlarging the distance between the upper portions of the second spacers 108. Thereby, it is more advantageous for removing the SAB layer 116 to be filled in between the second spacers 108, and a good metal silicide may be formed in the predetermined region for forming the first metal silicide layer 118 and the second metal silicide layer 120.

Figure 3A:
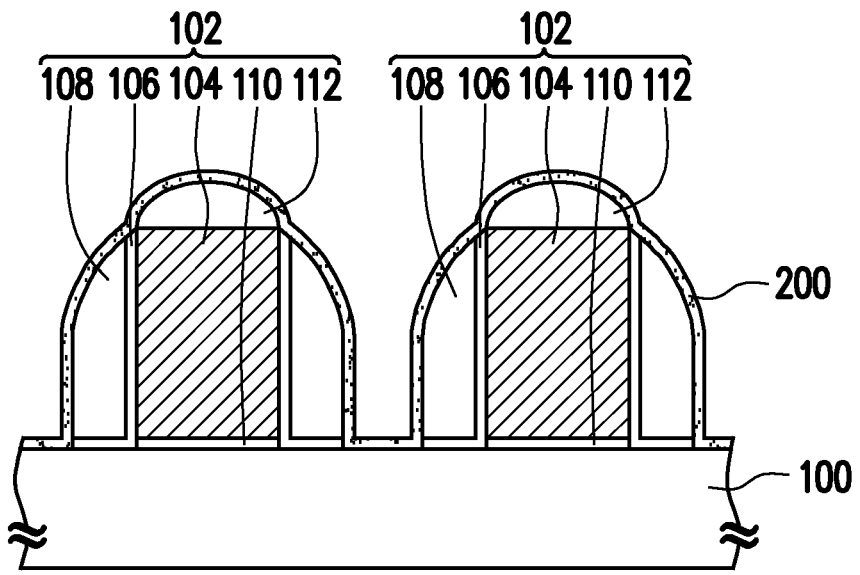
FIG. 3A to FIG. 3G are schematic sectional views of a manufacturing process of a semiconductor structure according to another embodiment of the invention.

FIG. 3A to FIG. 3G are schematic sectional views of a manufacturing process of a semiconductor structure according to another embodiment of the invention, wherein FIG. 3A is a descriptive drawing following FIG. 2A. If not particularly specified, reference numerals as in FIG. 3A to FIG. 3G that are identical to the reference numerals as in FIG. 2A indicate identical components of similar materials, characteristics, dispositions, methods of forming, and effects described with respect to FIG. 2A, which are not repeated hereinafter.

Referring to FIG. 2A and FIG. 3A, after the buffer layer 200 and the stress adjusting layer 202 are formed, and the annealing process is performed to the stress adjusting layer 202, the stress adjusting layer 202 is removed. The step of removing the stress adjusting layer 202 comprises, for example, dry etching or wet etching.

Figure 3B:
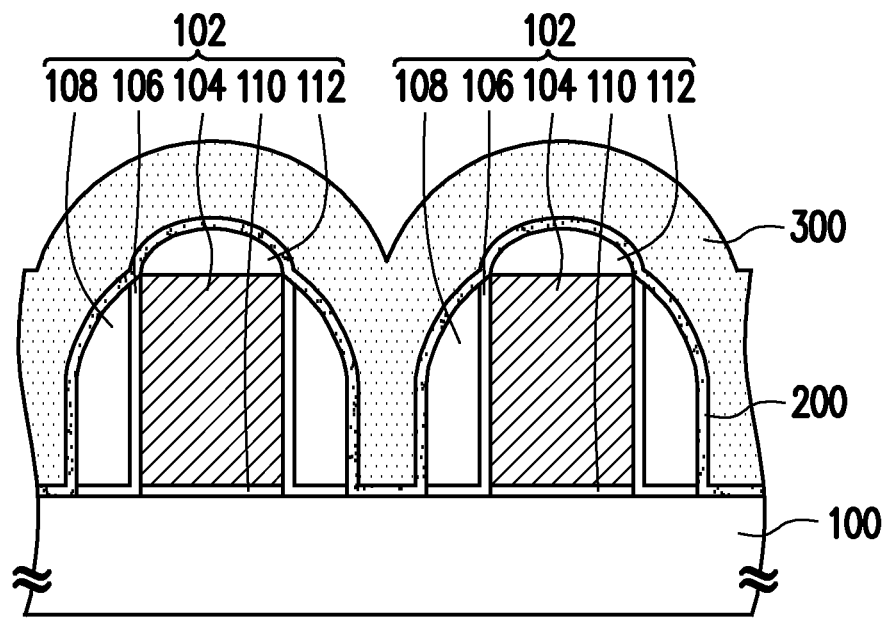

Referring to FIG. 3B, a filling layer 300 is formed on the buffer layer 200. The filling layer 300 fills in between the second spacers 108. The material of the filling layer 300 is, for example, a silicon oxide. The step of forming the filling layer 300 comprises, for example, high-density plasma chemical vapor deposition (HDP-CVD) or sub-atmospheric chemical vapor deposition (SACVD).

Figure 3C:
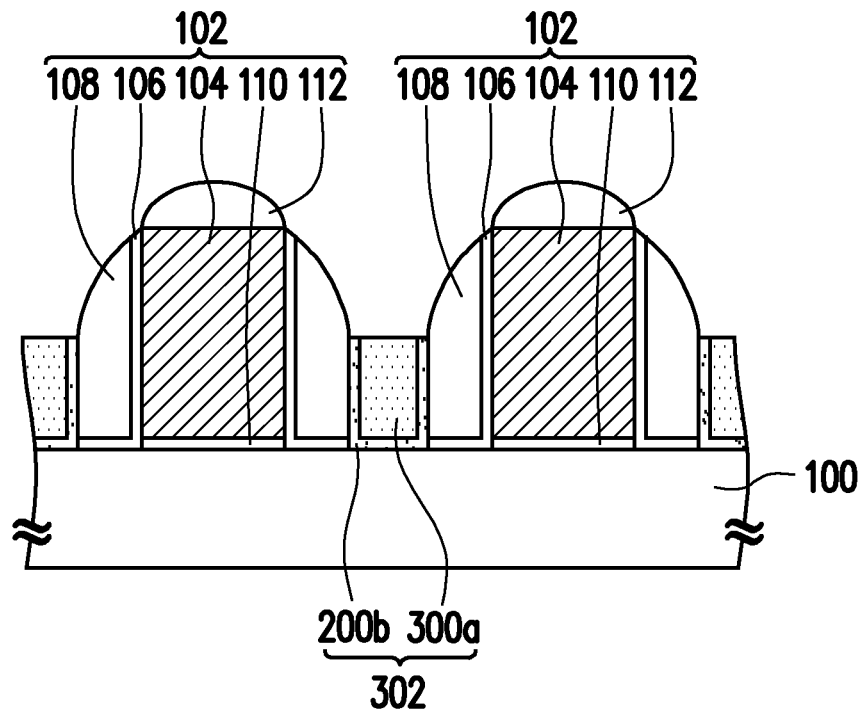

Referring to FIG. 3C, a part of the filling layer 300 is removed to form a first sub-protective layer 300a, and a part of the buffer layer 200 is removed to form a second sub-protective layer 200b. The first sub-protective layer 300a and the second sub-protective layer 200b expose the upper portions of the second spacers 108. The part of the filling layer 300 and the part of the buffer layer 200 may be removed simultaneously. The step of removing the part of the filling layer 300 and the part of the buffer layer 200 comprises, for example, dry etching or wet etching.

A protective layer 302 may thereby be formed in the region between two adjacent gate structures 102. The protective layer 302 includes the first sub-protective layer 300a and the second sub-protective layer 200b, wherein the first sub-protective layer 300a is disposed on the second sub-protective layer 200b. The protective layer 302 covers the lower portions of the second spacers 108 and exposes the upper portions of the second spacers 108.

Figure 3D:
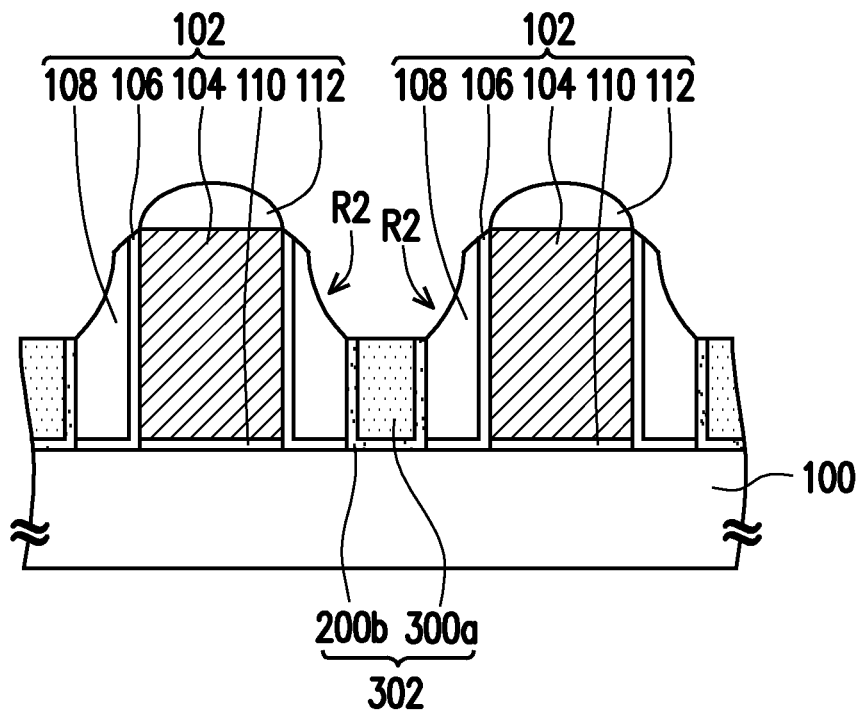

Referring to FIG. 3D, the protective layer 302 is used as a mask and the part of the upper portions of the second spacers 108 is removed to form a recess R2 for enlarging the distance between the upper portions of the second spacers 108. The step of removing the part of the upper portions of the second spacers 108 comprises, for example, dry etching such as RIE.

Figure 3E:
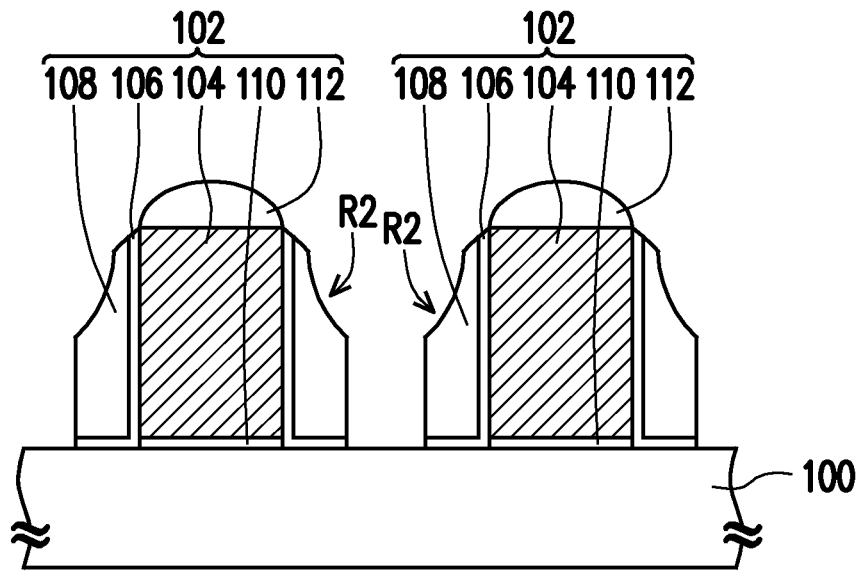

Referring to FIG. 3E, the protective layer 302 is removed. The step of removing the protective layer 302 includes removing the first sub-protective layer 300a and the second sub-protective layer 200b simultaneously. The step of removing the first sub-protective layer 300a and the second sub-protective layer 200b comprises, for example, wet etching. For instance, DHF may be used to remove the first sub-protective layer 300a and the second sub-protective layer 200b.

Figure 3F:
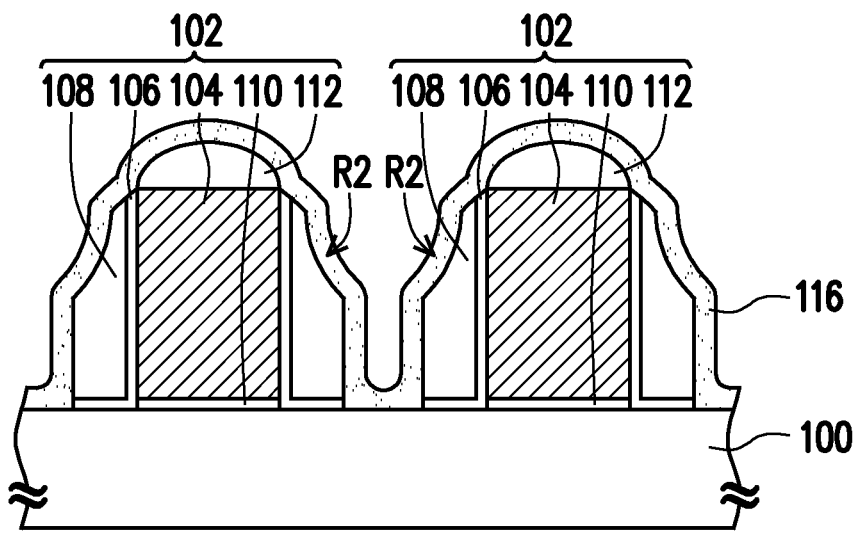
Figure 3G:
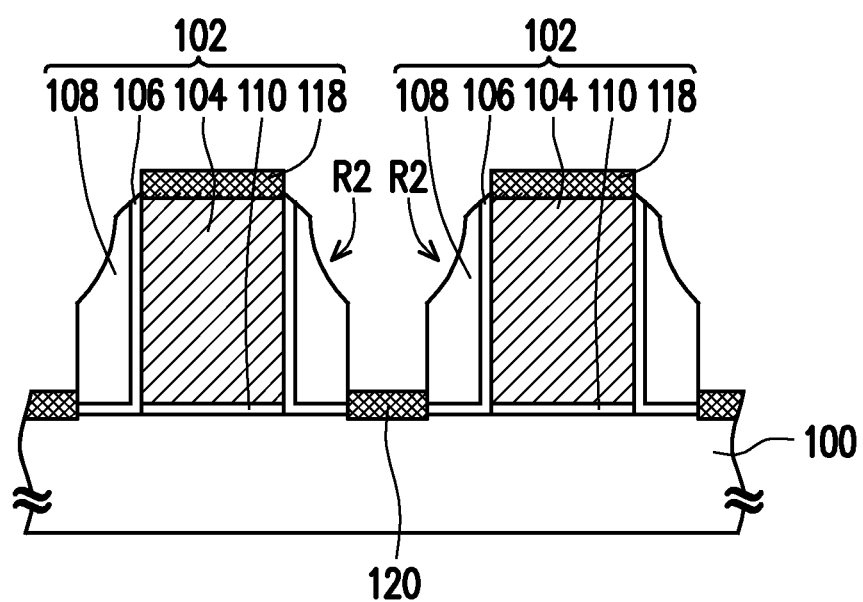

Referring to FIG. 3F, after the protective layer 302 is removed, the SAB layer 116 covering the gate structures 102 may be formed. Referring to FIG. 3G, a part of the SAB layer 116 is removed to expose the gate structures 102 and the substrate 100 between the gate structures 102. The hard mask layer 112 is removed to expose the gate 104. The first metal silicide layer 118 is formed on the gate 104, and the second metal silicide layer 120 is formed on the substrate 100 between the gate structures 102. The processes as in FIG. 2F and FIG. 2G are identical to the processes as in FIG. 3F and FIG. 3G, so the identical reference numerals indicate the identical components, and repeated descriptions thereof are omitted.

According to the above embodiments of the invention, in the manufacturing method of the semiconductor structure, the protective layer 302 is taken as the mask to remove the part of the upper portions of the second spacers 108 for enlarging the distance between the upper portions of the second spacers 108. As a result, it is more advantageous for removing the SAB layer 116 to be filled in between the second spacers 108, and a good metal silicide may be formed in the predetermined region for forming the first metal silicide layer 118 and the second metal silicide layer 120.

Besides, the semiconductor structures of FIG. 1C, FIG. 2E and FIG. 3E are similar, so the descriptions of the semiconductor structure as in FIG. 2E and FIG. 3E can be referred to the descriptions of the semiconductor structure as in FIG. 1C and are not repeated hereinafter.

In summary, in the semiconductor structure and the manufacturing method thereof according to the above embodiments of the invention, since the distance between the upper portions of the second spacers is enlarged, it is advantageous for removing the SAB layer to be filled in between the second spacers, and a good metal silicide may be formed in the predetermined region for forming the metal silicide.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A manufacturing method of a semiconductor structure, comprising:
    forming gate structures on a substrate, wherein each of the gate structures comprises:
        a gate, disposed on the substrate;
        a first spacer, disposed on a sidewall of the gate; and
        a second spacer, disposed on the first spacer,
            wherein in a region between two adjacent gate structures, the first spacers are separated from each other, and the second spacers are separated from each other;
    forming a protective layer in the region between the two adjacent gate structures, wherein the protective layer covers lower portions of the second spacers and exposes upper portions of the second spacers, and a top surface of the protective layer is lower than top surfaces of the second spacers;
    removing a part of the upper portions of the second spacers using the protective layer as a mask to enlarge a distance between the upper portions of the second spacers, wherein each of the second spacers has a recess, and an entire surface of the recess is a concave curved surface; and
    removing the protective layer.

2. The manufacturing method of the semiconductor structure according to claim 1, wherein steps of forming the protective layer and removing the part of the upper portions of the second spacers comprise:
    performing a reactive ion etching process to the second spacers with an etching gas to form the protective layer, and removing the part of the upper portions of the second spacers simultaneously, wherein the etching gas comprises a chlorine gas, an oxygen gas, and an inert gas.

3. The manufacturing method of the semiconductor structure according to claim 2, wherein a material of the protective layer comprises a polymer.

4. The manufacturing method of the semiconductor structure according to claim 2, wherein the step of removing the protective layer comprises plasma ashing.

5. The manufacturing method of the semiconductor structure according to claim 1, wherein the step of forming the protective layer comprises:
    forming a buffer layer conformally on the gate structures;
    forming a stress adjusting layer on the buffer layer, wherein the stress adjusting layer fills in between the second spacers;
    performing an annealing process to the stress adjusting layer;
    removing the stress adjusting layer;
    forming a filling layer on the buffer layer, wherein the filling layer fills in between the second spacers; and
    removing a part of the filling layer to form a first sub-protective layer and removing a part of the buffer layer to form a second sub-protective layer, wherein the first sub-protective layer and the second sub-protective layer expose the upper portions of the second spacers.

6. The manufacturing method of the semiconductor structure according to claim 5, wherein the part of the filling layer and the part of the buffer layer are removed simultaneously.

7. The manufacturing method of the semiconductor structure according to claim 5, wherein the step of removing the protective layer comprises removing the first sub-protective layer and the second sub-protective layer simultaneously.

8. The manufacturing method of the semiconductor structure according to claim 5, wherein the step of removing the part of the upper portions of the second spacers comprises dry etching.

* * * * *